US012408491B2

United States Patent
Dupre et al.

(10) Patent No.: US 12,408,491 B2
(45) Date of Patent: Sep. 2, 2025

(54) METHOD FOR MANUFACTURING A NATIVE EMISSION MATRIX HAVING DOPED AND POROSIFIED In(x)GaN

(71) Applicant: COMMISSARIAT À L'ÉNERGIE ATOMIQUE ET AUX ÉNERGIES ALTERNATIVES, Paris (FR)

(72) Inventors: Ludovic Dupre, Grenoble (FR); Carole Pernel, Grenoble (FR); Amélie Dussaigne, Grenoble (FR); Patrick Le Maitre, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 435 days.

(21) Appl. No.: 17/806,437

(22) Filed: Jun. 10, 2022

(65) Prior Publication Data

US 2022/0406968 A1    Dec. 22, 2022

(30) Foreign Application Priority Data

Jun. 16, 2021    (FR) .................................. FR2106387

(51) Int. Cl.
*H10H 20/825*    (2025.01)
*H01L 25/075*    (2006.01)
*H10H 20/01*    (2025.01)

(52) U.S. Cl.
CPC ..... *H10H 20/8252* (2025.01); *H01L 25/0753* (2013.01); *H10H 20/0137* (2025.01)

(58) Field of Classification Search
CPC ............ H10H 20/8252; H10H 20/0137; H01L 25/0753
See application file for complete search history.

(56) References Cited

U.S. PATENT DOCUMENTS

2019/0189835 A1* 6/2019 Dussaigne ......... H02K 15/0273
2021/0193870 A1    6/2021 Pernel et al.
(Continued)

FOREIGN PATENT DOCUMENTS

| EP | 3840016 A1 | 6/2021 |
| EP | 3840065 A1 | 6/2021 |
| WO | 2021050731 A1 | 3/2021 |

OTHER PUBLICATIONS

Even, A. et al., "Enhanced In incorporation in full InGaN heterostructure grown on relaxed InGaN pseudo-substrate", Applied Physics Letters, 2017, vol. 110, pp. 262103-1 262103-5.
(Continued)

*Primary Examiner* — Michael Jung
(74) *Attorney, Agent, or Firm* — Chrisman Gallo Tochtrop LLC

(57) ABSTRACT

A method for manufacturing a native emission matrix, comprising the following steps: a) providing a base structure comprising a substrate, a layer of GaN, a layer of doped In(x)GaN and an epitaxial regrowth layer of nid In(x)GaN, b) structuring first and second mesas in the base structure, the first mesa comprising a part of the layer of GaN, the layer of doped In(x)GaN and the epitaxial regrowth layer of not-intentionally doped In(x)GaN, the second mesa comprising a part of the layer of doped In(x)GaN and the epitaxial regrowth layer of not-intentionally doped In(x)GaN, c) electrochemically porosifying the second mesa, d) producing stacks on the mesas to form LED structures emitting at various wavelengths.

5 Claims, 8 Drawing Sheets

(56) References Cited

U.S. PATENT DOCUMENTS

| | | |
|---|---|---|
| 2021/0193873 A1 | 6/2021 | Pernel et al. |
| 2023/0048093 A1* | 2/2023 | Ali .................... H02K 15/0273 |
| 2023/0290806 A1* | 9/2023 | Zhu .................... H02K 15/0273 |
| 2024/0030275 A1* | 1/2024 | Avramescu .......... H10D 10/056 |

OTHER PUBLICATIONS

Jang- et al., "Electrical and structural properties of GaN films and GaN/InGaN light-emitting diodes grown on porous GaN templates fabricated by combined electrochemical and photoelectrochemical etching", Journal of Alloys and Compounds, 2014, vol. 589, pp. 507-512.

Search Report for French application No. 2106387 dated Mar. 7, 2022.

* cited by examiner

METHOD FOR MANUFACTURING A NATIVE EMISSION MATRIX HAVING DOPED AND POROSIFIED In(x)GaN

CROSS-REFERENCE TO RELATED APPLICATIONS

This application claims priority from French Patent Application No. 2106387 filed on Jun. 16, 2021. The content of this application is incorporated herein by reference in its entirety.

TECHNICAL FIELD

The present invention relates to the general field of colour microscreens.

The invention relates to a method for manufacturing a native emission matrix, and in particular an RGB matrix.

The invention also relates to a native emission matrix, and in particular an RGB matrix.

The invention finds applications in numerous industrial fields, and in particular in the field of colour microscreens based on micro-LEDs with a pitch of less than 10 µm.

PRIOR ART

Colour microscreens comprise blue, green and red pixels (RGB pixels).

Blue and green pixels can be manufactured from nitride materials and red pixels from phosphide materials. To combine these three types of pixel on the same substrate, the so-called "pick and place" technique is generally used. However, in the case of microscreens with pixels of less than 10 µm, this technique can no longer be used because not only of problems of alignment but also the time necessary for implementing such a technique on this scale.

Another solution consists in converting colours with quantum dots (QDs) or nanophosphides. However, controlling the deposition of these materials on small pixels is difficult and their resistance to flow is not sufficiently robust.

It is therefore crucial to be able to obtain the three RGB pixels natively with the same family of materials and on the same substrate. For this purpose, InGaN is the most promising material. This material can in fact theoretically cover the entire visible spectrum according to its indium concentration. Blue micro-LEDs based on InGaN already show high luminance, much greater than their organic homologues. To emit at wavelengths in the green, the quantum wells (QWs) of the LED must contain at least 25% indium and, for emission in the red, it is necessary to have at least 35% indium. Unfortunately, the quality of the InGaN material beyond 20% In is degraded because of the low miscibility of InN in GaN, but also because of the high compressive stress inherent in the growth of the InGaN active zone on GaN.

It is therefore essential to be able to reduce the overall stress in the structures based on GaN/InGaN.

To remedy this problem, several solutions have been envisaged.

A first solution consists in forming nanostructures, such as nanowires or pyramids, to be able to relax the stresses through the free edges. The growth of the axial nanowires can be implemented by molecular beam epitaxy (MBE). In practice, the low growth temperature used in growth by MBE leads to low internal quantum efficiencies (IQEs). Pyramids make it possible to curve dislocations. In particular, complete pyramids have semi-polar planes favourable to the incorporation of In and to the reduction of the internal electrical field of the active zone. For truncated pyramids, the truncated faces allow a growth of quantum wells on the c plane, which leads to a more homogeneous emission compared with an emission along the semi-polar planes of a complete pyramid. Alternatively, the growth can also be done in planar manner on planes other than the c face of the wurtzite structure, such as growth on the semi-polar planes, which are more favourable to the incorporation of In.

Another solution consists in reducing the stresses in the active zone of the LED structure by using a substrate or pseudo-substrate with a lattice parameter closer to the lattice parameter of the InGaN alloy of quantum wells. Thus, even with a planar configuration, it is possible to increase the degree of incorporation of In in InGaN. It has been shown that, when the lattice parameter of the substrate increases, the internal electrical field is reduced in comparison with a stressed layer with the same concentration of In and the emissions of the quantum wells are offset towards the red [1]. The relaxed layer of InGaN obtained makes it possible to grow an III-N heterostructure by metalorganic vapour phase epitaxy (MOVPE). However, at the present time, to our knowledge, the only substrate that has allowed this demonstration is the InGaNOS pseudo-substrate from Soitec obtained by the Smart Cut™ technique.

Another solution for reducing the overall stresses in the LED structures based on GaN/InGaN consists in porosifying the layer of GaN. In reference [2], initially a stack comprising a sapphire substrate covered by a layer of not-intentionally doped GaN (nid GaN) and a layer of n+ doped GaN are prepared. The layer of doped GaN fulfils the role of anode and a platinum grille fulfils the role of cathode. The electrochemical porosification is implemented in an oxalic acid solution (0.2 M) by applying a voltage of 15V for 30 minutes and then under ultraviolet radiation in a KOH solution (0.06 M) at 9V for 30 minutes. The porosified layer of GaN thus obtained makes it possible to grow an LED structure with multiple quantum wells (MQWs) composed of a layer of n+GaN, five GaN/InGaN quantum wells (QWs) and a p GaN contact layer. The great relaxation of the stresses leads to better electrical and optical properties, in particular with regard to photoluminescence (PL).

However, the crystalline quality of the layers of GaN of the LED depends on the diameter of the pores and on the porosity of the layer of porosified GaN, as well as on the thickness sought. It is therefore necessary to find the appropriate parameters on each occasion, which makes industrial implementation of the method complicated.

The manufacture of a relaxed epitaxial InGaN layer from a GaN/InGaN substrate and the manufacture of a relaxed epitaxial InGaN layer on InGaN mesas were implemented with porosification methods using electrochemical anodisation. The porosification step is implemented full-wafer by means of various transfers [3, 4].

DESCRIPTION OF THE INVENTION

One aim of the present invention is to propose a method at least partly remedying the drawbacks of the prior art, and making it possible to obtain a GaN/InGaN structure that is at least partially or even completely relaxed, with a view to manufacturing a native emission matrix and in particular an RGB (red green blue) matrix having red green blue pixels.

For this purpose, the present invention proposes a method for manufacturing a native emission matrix comprising the following steps:

providing a base structure comprising successively a substrate, a layer of not-intentionally doped (nid) GaN, a layer of doped In(x)GaN with x a value selected in the range from 0 to 8% and an epitaxial regrowth layer of not-intentionally doped In(x)GaN, b1) structuring a first mesa in the base structure comprising a part of the layer of nid GaN, the layer of doped In(x)GaN and the epitaxial regrowth layer of not-intentionally doped In(x)GaN, b2) structuring a second mesa in the base structure, the second mesa comprising a part of the layer of doped In(x)GaN and the epitaxial regrowth layer of not-intentionally doped In(x)GaN, the first mesa being electrically insulated from the second mesa, c) electrochemically porosifying the layer of doped In(x)GaN of the second mesa, d1) depositing a first stack on the epitaxial regrowth layer of not-intentionally doped In(x)GaN of the first mesa, by means of which a first LED structure emitting at a first wavelength, for example blue, is obtained, d2) depositing a second stack on the epitaxial regrowth layer of not-intentionally doped In(x)GaN of the second mesa, by means of which a second LED structure emitting at a second wavelength, for example red, is obtained.

The invention is distinguished fundamentally from the prior art by the use of a base structure (a so-called patterned substrate) comprising a plurality of mesas having various relaxation levels for manufacturing native emission matrices. At the time of the epitaxy growth of one or more stacks of layers on these mesas, the LED structures having various wavelengths are thus obtained.

The method leads to a selective porosification of the mesas by means of a particular electrical addressing. The mesas that must not be porosified are electrically insulated by means of an etching as far as a non-doped layer.

The successive porosification and epitaxy steps lead to several emission wavelengths being obtained.

Advantageously, the method furthermore includes a step b3) during which a third mesa is structured in the base structure and a step d3) during which a third stack is deposited on the epitaxial regrowth layer of not-intentionally doped In(x)GaN of the third mesa, by means of which a third LED structure emitting at a third wavelength, for example green, is obtained.

Advantageously, the first LED structure emits in the blue, the second LED structure emits in the red and the third LED structure emits in the green, by means of which an RGB matrix is formed.

According to a first advantageous variant embodiment, the third mesa comprises a part of the layer of nid GaN, the layer of doped In(x)GaN and the epitaxial regrowth layer of not-intentionally doped In(x)GaN.

According to this first variant, advantageously, the step b3) is implemented simultaneously with the step b1) and/or the step d3) is implemented simultaneously with the step d2).

Advantageously, the step d3) is implemented simultaneously with the step d2): the same stack of layers is deposited on the second mesa and on the third mesa. The growth parameters are identical but the resulting LED structures are different since the concentration of In of each of the layers will vary according to the state of stress of the mesa.

Advantageously, according to this first variant:
between the step c) and the step d1), a first mask made from $SiO_2$ or SiN is deposited on the second mesa and the third mesa, the first mask being removed after the step d1), and between the step d1) and the steps d2) and d3), a second mask made from $SiO_2$ or SiN is deposited on the first mesa, the second mask being removed after the steps d2) and d3).

According to a second advantageous variant embodiment, the third mesa comprises a part of the layer of doped In(x)GaN and the epitaxial regrowth layer of not-intentionally doped In(x)GaN, by means of which the third mesa is electrically insulated from the second mesa, and the method comprises an additional step c') during which the layer of doped In(x)GaN of the third mesa is electrochemically porosified.

According to this second variant, advantageously, the steps d1, d2) and d3) are implemented simultaneously. The incorporation of In in the whole of the structure, and in particular in the quantum wells, is variable according to the degree of relaxation of the dense epitaxial regrowth layer. The more relaxed the layer, the more the emission wavelength increases. Thus, by depositing the same stack of layers on the three mesas, several LED structures emitting at various wavelengths are obtained, the first, second and third structures advantageously being adapted for emitting respectively in the blue, the red and the green.

The steps c) and c') can be implemented simultaneously or successively.

Advantageously, the layer of nid GaN has a thickness of between 100 nm and 4 μm and/or the layer of doped In(x)GaN has a thickness of between 100 nm and 800 nm and/or the epitaxial regrowth layer of not-intentionally doped In(x)GaN has a thickness of between 10 nm and 200 nm.

The method has numerous advantages:
it is simple to implement,
the mesa structuring associated with the porosification of the n doped layer provide the compliance effect,
it leads to a partial or complete relaxation of stresses and reduces the piezoelectric polarisation by comparison with a stress layer with the same In concentration,
it allows a so-called "bottom up" approach for manufacturing μLED and μdisplay: the growth of the optical structures (N, PQs, P) is implemented after mesa pixelisation, whatever the size of the pixels, and makes it possible to be free from problems of alignment as for the "pick and place" method; in addition, there is no impact of the method for etching the pixels on the efficacy of the micro-LEDs, which makes it possible to produce a micrometric pixel,
limitation of the number of epitaxies necessary for obtaining the RGB matrix: 2 epitaxies at a maximum instead of three,
possible use of the conventional blue LED structure for the blue pixel and possible use of the all-InGaN LED structure adapted for the red both for the green pixel and for the red pixel (by virtue of an adapted degree of relaxation of the porous mesa for the red LED structure), which makes it possible to maximise the EQE for the blue and red,
precise adjustment of the relaxation of the mesas via an adapted porosification step for controlling the emission wavelength,
the method does not require a transfer step for being able to porosify the doped layer.

The invention also relates to a native emission matrix comprising:
a base structure comprising successively a substrate, a layer of nid GaN, a layer of doped In(x)GaN with x from 0 to 8% and an epitaxial regrowth layer of not-intentionally doped In(x)GaN,
a first mesa formed in the base structure comprising a part of the layer of GaN (nid), the layer of doped In(x)GaN and the epitaxial regrowth layer of not-intentionally doped In(x)GaN, the first mesa being covered by a first LED structure emitting at a first wavelength, for example blue, a second mesa formed in the structure comprising a part of the layer of doped In(x)GaN and the epitaxial regrowth layer of not-intentionally doped In(x)GaN, the layer of doped In(x)GaN of the second mesa being porosified, the second mesa being covered by a second LED structure emitting at a second wavelength, for example red.

Advantageously, the matrix comprises a third mesa formed in the base structure and covered by a third LED structure, emitting at a third wavelength, for example green.

According to an advantageous first variant, the third mesa comprises a part of the nid GaN layer, the layer of doped In(x)GaN and the epitaxial regrowth layer of not-intentionally doped In(x)GaN.

According to this first variant, advantageously, the third LED structure is formed simultaneously with the second LED structure.

According to an advantageous second variant embodiment, the third mesa comprises a part of the layer of doped In(x)GaN and the epitaxial regrowth layer of not-intentionally doped In(x)GaN, the layer of doped In(x)GaN of the third mesa being porosified.

According to this second variant, advantageously, the first LED structure, the second LED structure and the third LED structure are formed simultaneously.

Other features and advantages of the invention will emerge from the remainder of the description that follows.

It goes without saying that this additional description is given only by way of illustration of the object of the invention and must under no circumstances be interpreted as a limitation to this object.

BRIEF DESCRIPTION OF THE DRAWINGS

The present invention will be best understood from the reading of the description of example embodiments given purely by way of indication and in no way limitatively, referring to the accompanying drawings, on which.

Figure 1A:
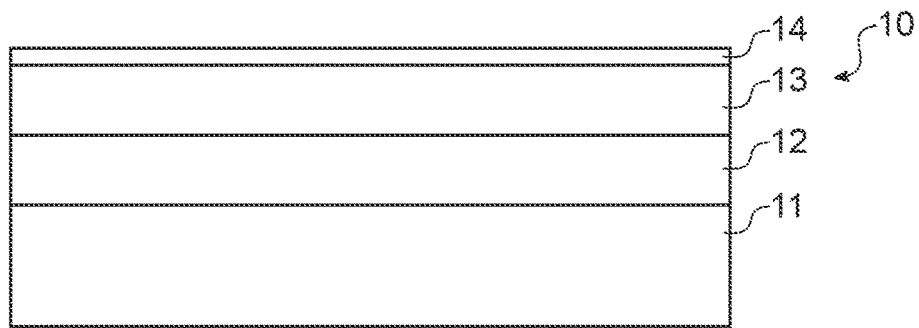
FIGS. 1A to 1J show, schematically and in cross section, various steps of a method for manufacturing an RGB matrix according to a first particular variant embodiment of the invention.

The various parts shown in the figures are not necessarily shown to a uniform scale, to make the figures more legible.

The various possibilities (variants and embodiments) must be understood as not being exclusive of one another and may be combined with one another.

Furthermore, in the following description, the terms that depend on the orientation, such as "top", "bottom", etc. of a structure apply on the understanding that the structure is oriented as illustrated on the figures.

DETAILED DESCRIPTION OF PARTICULAR EMBODIMENTS

Although in no way limitative, the invention particularly finds applications for manufacturing a multispectral device, for example LEDs of various colours, in a simplified fashion, or a multi-colour microscreen ("microdisplay").

Hereinafter, we will more particularly describe the method for manufacturing a native emission matrix of the RGB type (i.e. with three different emission wavelengths), but the method can be applied to any matrix having at least two different emission wavelengths.

Referring to the accompanying figures, we will now describe the method for manufacturing an RGB matrix. This method can be implemented according to several variant embodiments. In particular, it can be implemented according to a first variant embodiment (shown on FIGS. 1A-1J) and according to a second variant embodiment (shown on FIGS. 5A-5F). These methods implement the following steps:

providing a base structure 10 successively comprising a substrate 11, a layer of nid GaN 12, a layer of doped In(x)GaN 13 with x from 0 to 8% and an epitaxial regrowth layer of not-intentionally doped In(x)GaN 14 (FIGS. 1A and 5A), b) implementing steps b1), b2) and b3) for structuring respectively a first series of mesas S1, a second series of mesas S2 and a third series of mesas S3 in the base structure 10 (FIGS. 1B-1C and 5B), c) electrochemically porosifying the layer of doped In(x)GaN 13 of at least one series of mesas (FIGS. 1D and 5C-5D), d) depositing one or more stacks of layers 100 or 110, 200, 300 on the epitaxial regrowth layers of not-intentionally doped In(x)GaN 14 of the first series of mesas S1, of the second series of mesas S2 and of the third series of mesas S3, by means of which a first series of blue LEDs, a second series of red LEDs and a third series of green LEDs are respectively obtained (FIGS. 1E-1J and 5E-5F).

The stack or stacks intended to form the LEDs are advantageously formed on series of mesas to obtain series of LEDs of various colours. Each series of mesas comprises at least one mesa and preferably several mesas.

The base structure 10 for these two variant embodiments of the method comprises and preferably consists of (FIGS. 1A and 5A):

a substrate 11, a layer of nid GaN 12, a layer of doped In(x)GaN 13 with x a value selected in the range from 0 to 8%, an epitaxial regrowth layer of not-intentionally doped In(x)GaN with x a value selected from the range from 0 to 8%.

The substrate 11 is for example made from sapphire or silicon. It has a thickness for example of between 300 μm and 1 mm.

The layer of GaN 12 is a not-intentionally doped (nid) layer. It has a thickness for example of between 100 nm and 6 μm.

The layer of doped In(x)GaN 13 has a proportion of In x of between 0% and 8%. It may therefore be a layer of GaN or a layer of InGaN. It is for example n doped of $3\times10^{18}$ $cm^{-3}$ to $1.5\times10^{19}$ $cm^{-3}$, preferably from $6\times10^{18}$ $cm^{-3}$ to $1.5\times10^{19}$ $cm^{-3}$. This layer may be porosified. It preferably has a thickness of between 100 nm and 1 μm, for example between 800 nm and 1 μm.

The epitaxial regrowth layer of In(x)GaN is not intentionally doped 14. It has a proportion of In x of between 0% and 8%. It may therefore be a layer of GaN or a layer of InGaN. It has for example a thickness of between 10 nm and 200 nm.

During steps b1), b2) and b3), a first series of mesas S1, a second series of mesas S2 and a third series of mesas S3 are structured respectively in the base structure 10. For reasons of clarity, only one mesa is shown per series on the figures in cross section.

The mesas, also referred to as elevations, are elements in relief. They are obtained for example by etching a continuous layer or several continuous layers superimposed, so as to leave only a certain number of "reliefs" of this layer or layers. The etching is generally a plasma etching (or dry etching), for example based on chlorinated gas $Cl_2$ or $SiCl_4$. The mesas can be formed in the base structure 10 for example by photolithography. The reliefs make it possible to define pixels.

Preferably, the sides of the mesas are perpendicular to this stack of layers.

The mesas can have a square, circular or hexagonal shape. The dimensions of the mesas range for example from 500 nm to 500 μm.

The spacing ("pitch") between two consecutive mesas ranges for example from 50 nm to 20 μm.

Figure 1B:
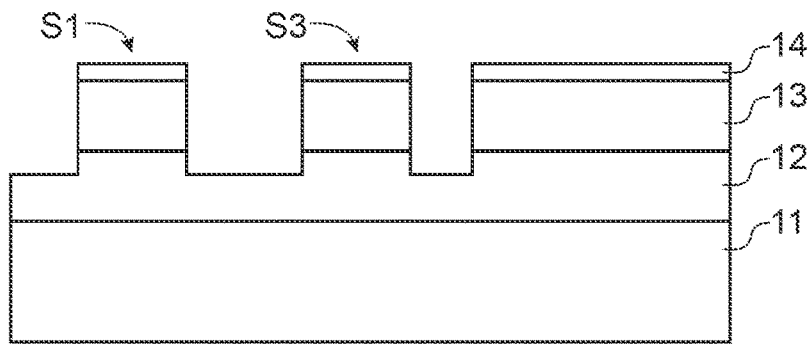
Figure 5A:
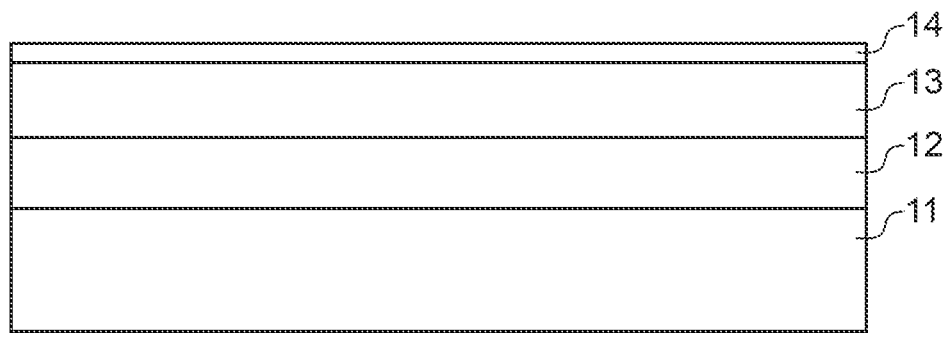
FIGS. 5A to 5F show, schematically and in cross section, various steps of a method for manufacturing an RGB matrix according to a second particular variant embodiment of the invention.
Figure 5B:
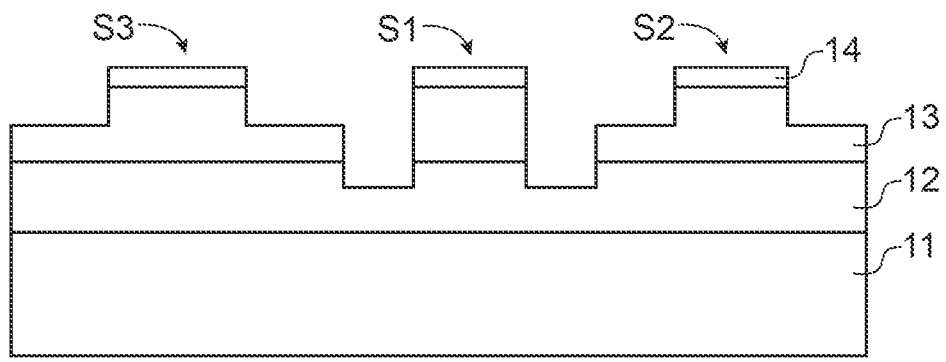

In a step b1), a first series of mesas S1 is structured in the base structure 10, the mesas in the first series S1 comprising a part of the layer of nid GaN 12, the layer of doped In(x)GaN 13 and the epitaxial regrowth layer of not-intentionally doped In(x)GaN 14, by means of which the mesas in the first series S1 are each electrically insulated (FIGS. 1B, 5B).

The step b1) leads to an electrical insulation of the first series of mesas S1 by means of an etching as far as the layer of nid GaN 12. These mesas will not be porosified during the electrochemical porosification step (step c)).

Figure 1C:
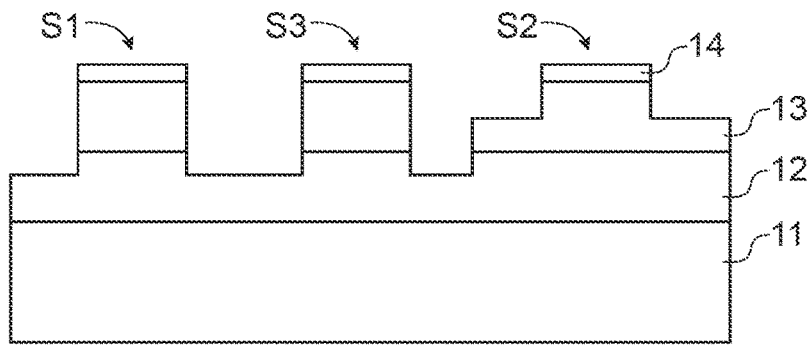
Figure 1D:
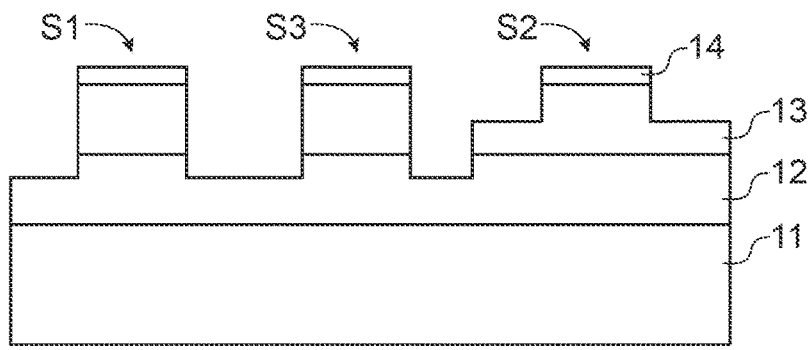
Figure 1E:
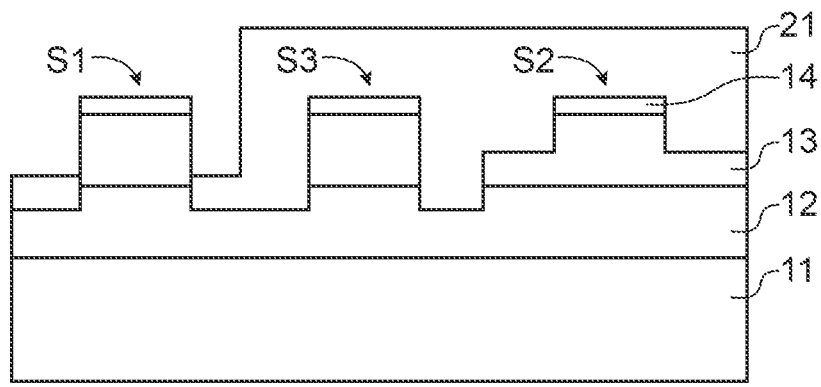
Figure 1F:
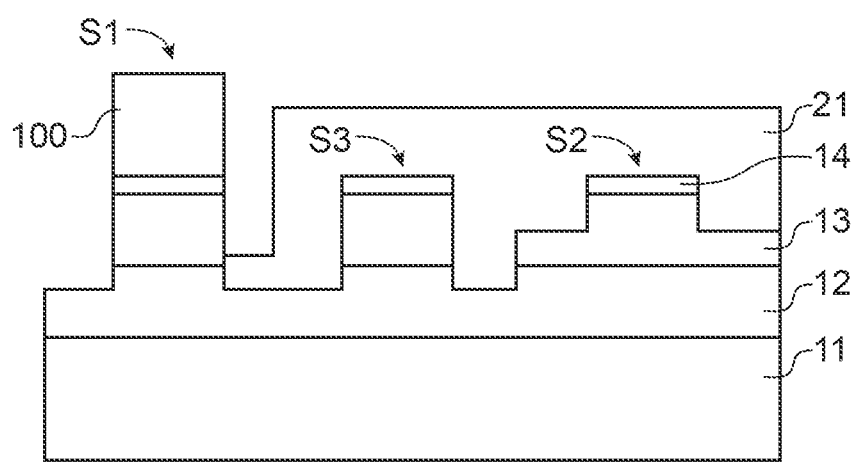
Figure 1G:
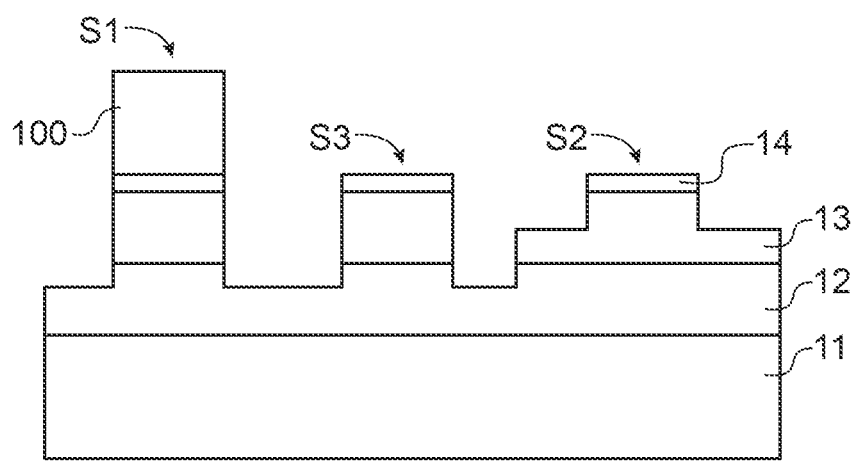
Figure 1H:
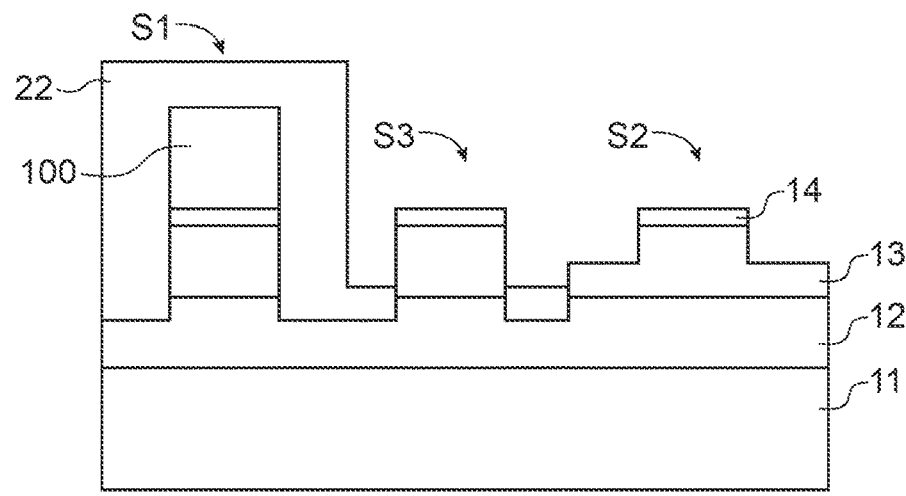

In a step b2), a second series of mesas S2 is structured in the base structure 10, the mesas in the second series comprising a part of the layer of doped In(x)GaN 13 and the epitaxial regrowth layer of not-intentionally doped In(x) GaN 14, by means of which the mesas in the second series S2 are electrically interconnected with each other (FIG. 1C, 5B).

Step b2) leads to the formation of a second series of mesas S2 electrically interconnected by means of an etching as far as the layer of doped In(x)GaN 13. All the mesas formed by this etching are electrically connected by the doped layer. These mesas will be porosified during the electrochemical porosification step (step c)).

During step c), at least the mesas in the second series of mesas S2 interconnected by the doped layer are selectively porosified.

This step is implemented in accordance with the following sub-steps:

electrically connecting the electrically conductive layer of doped In(x)GaN layer 13 of the base structure 10 and a counter-electrode to a voltage or current generator, immersing the base structure 10 and the counter-electrode in an electrolytic solution, applying a voltage or a current between the layer of doped In(x)GaN 13 and the counter-electrode so as to porosify the layer of doped In(x)GaN 13 of the mesas electrically connected to the generator.

During the anodisation step, the doped layer 13 fulfils the role of working electrode (WE).

The counter-electrode is made from a noble and chemically inert electrically conductive material (to avoid contamination of the bath with ions coming from this electrode), such as for example a metal such as platinum.

The electrodes are immersed in an electrolyte, also referred to as an electrolytic bath or electrolytic solution. The electrolyte may be acidic or basic. The electrolyte is for example oxalic acid. It may also be KOH, HF, $HNO_3$, $NaNO_3$, $H_2SO_4$ or one of the mixtures thereof. It will be possible to use for example a mixture of oxalic acid and $NaNO_3$.

The voltage applied between the doped layer 13 and the counter-electrode can range from 1 to 100 V. It is applied, for example, for a period ranging from a few seconds to several hours. The porosification is complete when there is no longer any current at imposed potential. At this moment, the entire layer 13 is porosified and the electrochemical reaction stops.

The electrochemical anodisation step can be implemented under ultraviolet (UV) light. The method may also include a first electrochemical anodisation without adding ultraviolet radiation and a second electrochemical anodisation adding ultraviolet radiation.

Advantageously, the porosification takes place throughout the volume of the layer of doped In(x)GaN 13 of the mesas electrically connected together.

At the end of the porosification step, the degree of porosity of the layer of doped In(x)GaN 13 is at least 10%. It preferably ranges from 25% to 60%.

The largest dimension (the height) of the pores can vary from a few nanometres to a few micrometres. The smallest dimension (the diameter) can vary from a few nanometres to around 100 nanometres, in particular 30 to 70 nm.

The porosification obtained (degree of porosity and size of the pores) depends on the doping of the layer of doped In(x)GaN 13 of the mesas and on the parameters of the method (voltage applied, duration, nature and concentration of the electrolyte, chemical post-treatment or annealing). Varying the porosification makes it possible to control the degree of relaxation and therefore the degree of incorporation of In in the re-epitaxed layers. In addition, reducing the state of stress reduces the surface segregation effect of the In in the InGaN layers. The porosification, and in particular the size of the pores, can vary subsequently, during the growth of epitaxy according to the temperature applied.

During step d), one or more stacks 100 or 110, 200, 300 are re-epitaxed on the epitaxial regrowth layers 14 of the mesas, by means of which LED structures are formed and, advantageously, red, green, blue LED structures.

The stack or stacks of layers deposited at step d) can be obtained in accordance with one or more epitaxy recipes so as to obtain first, second and third LED structures emitting at various wavelengths (advantageously in the blue, the red and the green respectively).

We shall now describe in more detail two variant embodiments of the method:
- a first variant implementing a porosification step (only one series of mesas are porosified) and two successive epitaxy steps (FIGS. 1A-1J),
- a second variant implementing the porosification of two series of mesas and a single epitaxy step (FIGS. 5A-5F).

We shall now describe in more detail the first variant embodiment.

Step b3) of this variant consists in structuring a third series of mesas S3, the mesas in the third series S3 comprising a part of the layer of nid GaN 12, the layer of doped In(x)GaN 13 and the epitaxial regrowth layer of not-intentionally doped In(x)GaN 14, by means of which the mesas in the third series S3 are each electrically insulated (FIG. 1B).

Step b3) leads to an electrical insulation of the third series of mesas. These mesas will not be porosified during the electrochemical porosification step (step c)).

Advantageously, step b1) and step b3) are implemented simultaneously.

Step c) is implemented as previously described.

At the end of step c), in accordance with this first variant embodiment, a pseudo-substrate is obtained, comprising (FIG. 1D):
- porosified mesas (second series of mesas S2) comprising a porosified layer 13 and a relaxed dense epitaxial regrowth layer 14 ready for red epitaxy,
- non-porosified mesas (first series of mesas S1 and third series of mesas S3) comprising a non-porosified doped layer 13 and a non-relaxed dense epitaxial regrowth layer 14 ready for blue epitaxy and for green epitaxy.

Advantageously, the final lattice parameter a of the porosified mesa is of the order of (at ambient temperature— typically 20° C.): 3.205-3.210 Angs. Such a lattice parameter makes it possible to obtain, in the InGaN quantum wells of the red LED, $x_{In}$=40%. The epitaxy parameters corresponding to such a red LED structure give, on a non-relaxed mesa such as those in the third series S3, an incorporation of the order of $x_{In}$=25% corresponding to a green emission. It is thus possible to implement a single epitaxy step to form the green and red LEDs.

Figure 1I:
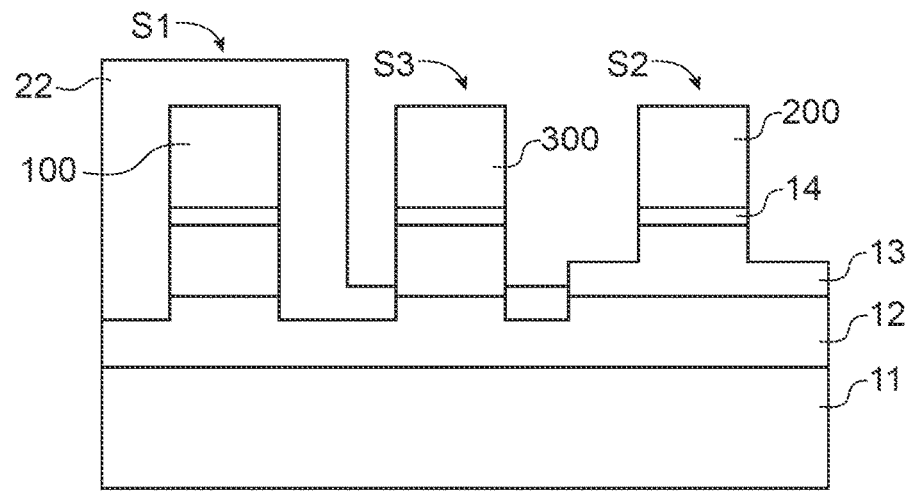

Advantageously, according to this first variant embodiment, the epitaxy growths are implemented in two steps, i.e. there are two epitaxy growths:
- one epitaxy growth for the first series of mesas S1 (FIG. 1F),
- a single epitaxy growth for the second series of mesas S2 and the third series of mesas S3 (FIG. 1I).

Figure 1J:
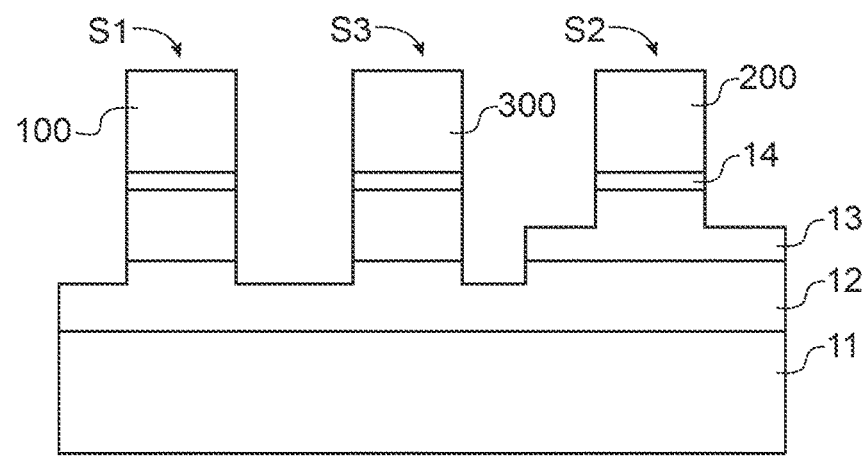

By way of illustration, step d), according to this first variant embodiment, includes the following sub-steps:
- depositing a first mask 21, for example made of $SiO_2$ or SiN with a thickness for example of between 100 nm and 1 µm, on the porosified second series of mesas S2 and on the third series of mesas S3 (FIG. 1E),
- implementing epitaxy of a first stack 100 on the first series of mesas S1, by means of which a first series of blue LEDs is obtained (FIG. 1F),
- removing the first mask 21, preferably with wet chemistry, for example with a solution of hydrofluoric acid (HF) for an $SiO_2$ mask (FIG. 1G),
- depositing a second mask 22, for example made of $SiO_2$ or SIN, on the first series of mesas S1 (FIG. 1H),
- implementing epitaxy in a single step on one and the same stack (200, 300) on the porosified second series of mesas S2 and on the third series of mesas S3, by means of which a second series of red LEDs and a third series of green LEDs are respectively formed (FIG. 1I),
- removing the second mask 22, preferably with wet chemistry, for example with a solution of hydrofluoric acid (HF) for an $SiO_2$ mask (FIG. 1J).

The masks can be produced in accordance with the following sub-steps: deposition of the full-wafer mask, lithography and plasma etching, for example, based on fluorinated gases such as $CHF_3$ or $SF_6$.

To obtain blue LEDs on the first series of mesas S1, it is possible to use various sacks 100 or 110.

Figure 2:
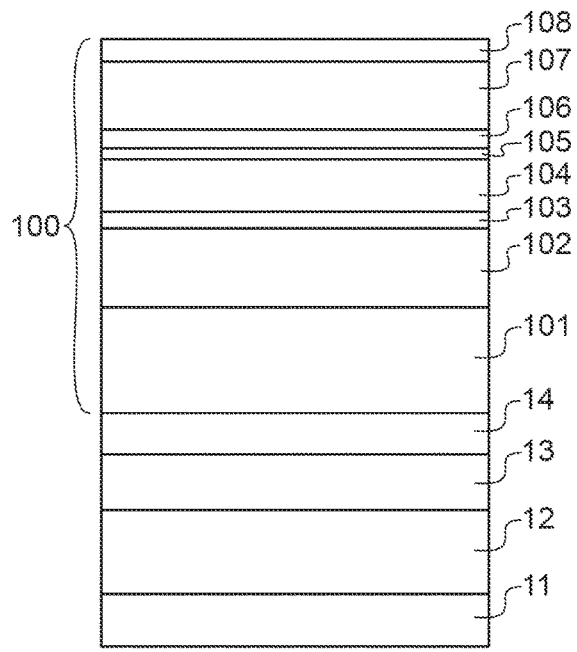
FIG. 2 shows, schematically and in cross section, an LED structure according to a particular embodiment of the invention.

For a base structure 10 of the GaN type (x=0%), it will be possible to select for example a re-epitaxed stack 100 comprising successively from the epitaxial regrowth layer (FIG. 2):
- a GaN:Si layer ("buffer") 101, having for example a thickness of less than 1 µm,
- a layer of InGaN/GaN 102 formed by 20×$In_{0.15}$GaN/$GaN_{0.85}$ (thicknesses 2.8 nm/10 nm),
- a spacer layer of not-intentionally doped GaN 103 with a thickness of 10 nm for example,
- an active zone 104 formed by multiple quantum wells (MQWs), formed by 5×$In_{0.15}Ga_{0.85}$N/GaN (thicknesses 2.5 nm/10 nm),
- a spacer layer of not-intentionally doped GaN 105, for example 30 nm thick,
- a layer of AlGaN:Mg 106 with a thickness of 15 nm,
- a p doped GaN layer 107 (200 nm),
- a p+++ doped GaN layer 108 (20 nm).

Figure 3:
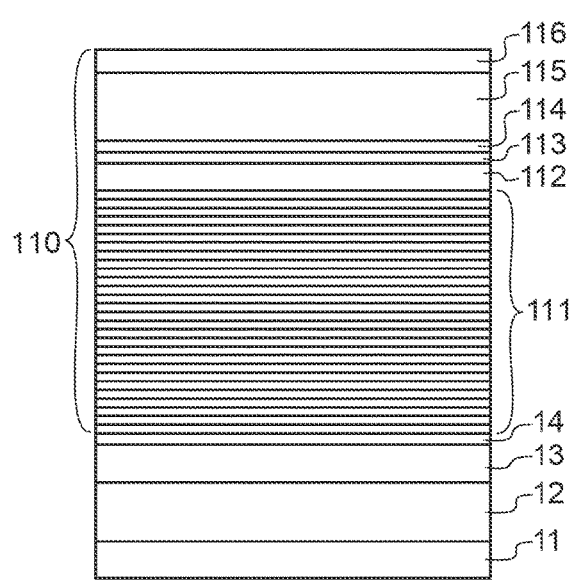
FIG. 3 shows, schematically and in cross section, an LED structure according to another particular embodiment of the invention.

For a base structure 10 of the InGaN type (0%<x≤8%), it will be possible for example to select a re-epitaxed stack 110 comprising successively, from the epitaxial regrowth layer (FIG. 3):
- an n doped InGaN layer 111 formed by 15×InGaN/GaN (thicknesses 22 nm/1.8 nm) or formed by a single buffer layer of n doped InGaN,
- an active zone 112 formed by multiple quantum wells (MQWs), formed by 5×$In_{0.15}Ga_{0.85}$N/InGaN (thicknesses 2.5 nm/6 nm),
- a layer of nid (Ga, In)N 113,
- a p doped AlGaN layer 114,
- a p doped GaN layer 115 (125 nm),
- a p+++ doped GaN layer 116 (25 nm).

For the single epitaxy growth making it possible to simultaneously form the second series of red LEDs and the third series of green LEDs, an all InGaN LED stack 200 adapted both to epitaxy on relaxed InGaN and to red emission will for example be selected, so as to obtain a red emission on S2 and green on S3 for the same growth parameters. By acting on the degree of porosification of the mesas, and therefore on the degree of relaxation, it is possible to obtain different wavelengths for the same LED epitaxy method. The proportion of In in the various layers of the LED structure will in fact vary automatically according to the state of stress of the mesa, which will lead to a red emission for the second series S2 and green for the third series S3.

The lattice parameter of the mesas S2 must therefore be of the order of 3.205-3.210 Å, and that of the mesas S3 of the same order as that of the GaN (stressed or not, i.e. 3.184-3.189 Å).

Figure 4:
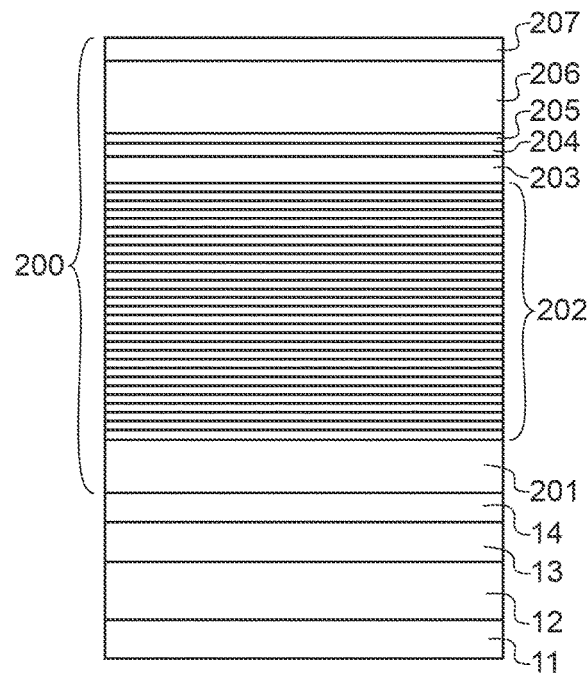
FIG. 4 shows, schematically and in cross section, an LED structure according to another particular embodiment of the invention.

The re-epitaxed stack 200 is adapted to red emission for the LEDs in the second series of mesas and which will lead to a green emission for the LEDs in the third series of mesas. The stack 200 that is deposited comprises for example, from the epitaxial regrowth layer (FIG. 4):

a layer of In(x)GaN 201 with x between 3 and 6%, an n doped InGaN layer 202 formed by 15×InGaN/GaN (thicknesses 22 nm/1.8 nm) or formed by a single buffer layer of n doped InGaN, an active zone 203 formed by multiple quantum wells (MQWs), formed by 5×$In_{0.40}Ga_{0.60}N$/InGaN (thicknesses 2.5 nm/6 nm), a layer of nid (Ga, In)N 204, a p doped (Al, Ga)N layer 205, a p doped InGaN layer 206 (125 nm), a layer of p+++ doped InGaN 207 (25 nm).

This stack 200 leads to $x_{In}$=25% for the green and 40% for the red in the InGaN wells.

If the green LEDs and the red LEDs are not made simultaneously, then the green LEDs are advantageously produced before the red LEDs for reasons of thermal budget.

We shall now describe in more detail the second variant embodiment.

Step b3) of this variant consists in structuring a third series of mesas S3 comprising a part of the layer of doped In(x)GaN 13 and the epitaxial regrowth layer of not-intentionally doped In(x)GaN 14, by means of which the mesas in the third series S3 are electrically interconnected together (FIG. 5B).

Step b3) leads to the formation of a series of electrically interconnected mesas S3 by means of an etching as far as the layer of doped In(x)GaN 13. All the mesas formed by this etching step are electrically connected by the doped layer 13.

Figure 6A:
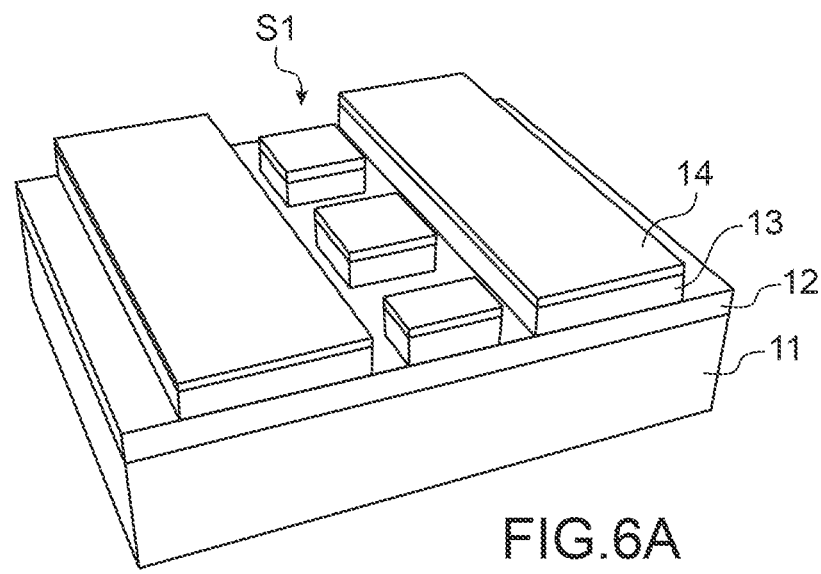
FIGS. 6A and 6B show, schematically and in three dimensions, steps of etching series of mesas, according to a particular implementation of the second variant embodiment.
Figure 6B:
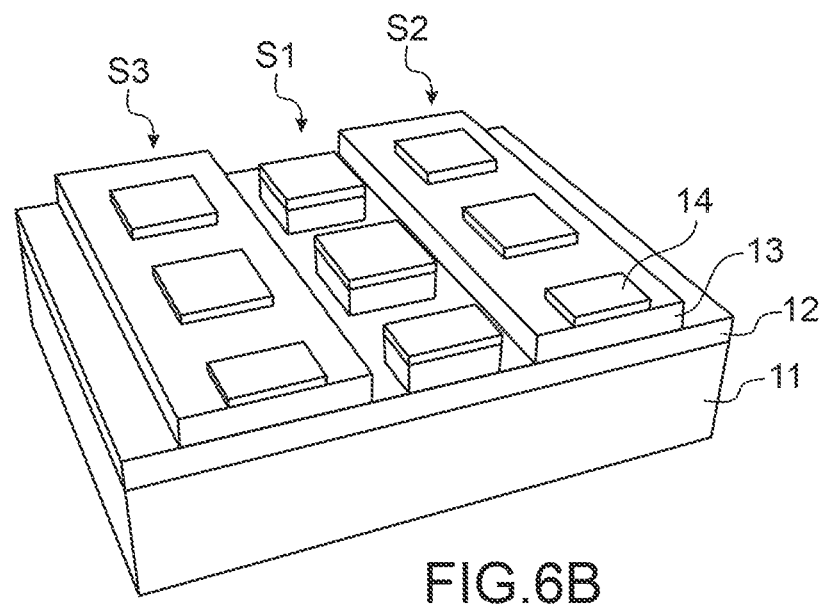

Advantageously, step b1) is implemented (FIG. 6A) and then steps b2) and b3) are implemented simultaneously (FIGS. 6B and 5B). Alternatively, it is possible to reverse the order of the steps: b2) and b3), then b1).

Figure 5C:
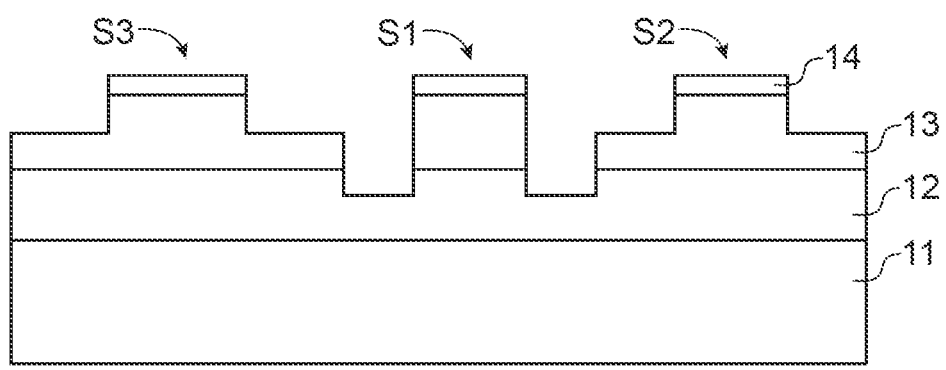

In step c), the second series of mesas S2 intended for red emission are porosified. A potential E1 will for example be selected, which will be applied during a time t1, to obtain a degree of porosity p1 and a relaxation r1 (FIG. 5C).

Figure 5D:
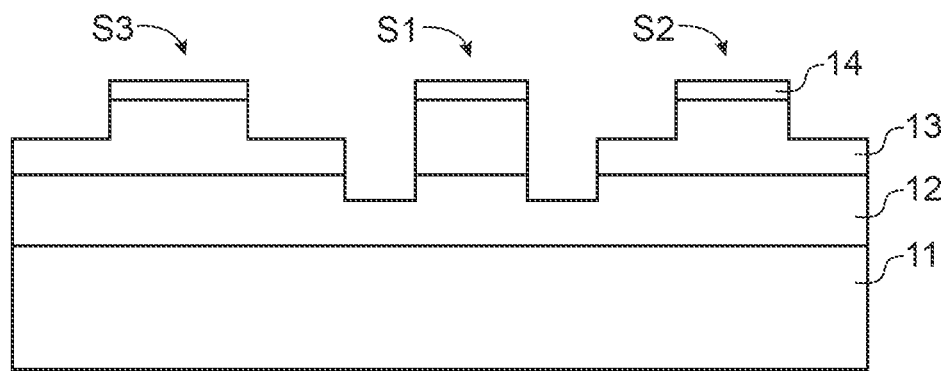

The method according to this variant embodiment comprises an additional step c'). During step c'), the third series of mesas S3 intended for the green emission are porosified. A potential E2 will for example be selected, which will be applied for a time t2, for a degree of porosity p2 and relaxation r2 (FIG. 5D).

The degrees of porosification p1 and p2 are very different with p1>>p2. Advantageously, two degrees of porosification will be selected that differ from 25% to 50%.

During steps c) and c'), the first series of mesas S1 intended for blue emission are not porosified.

Steps c) and c') can be implemented simultaneously or consecutively.

Figure 7:
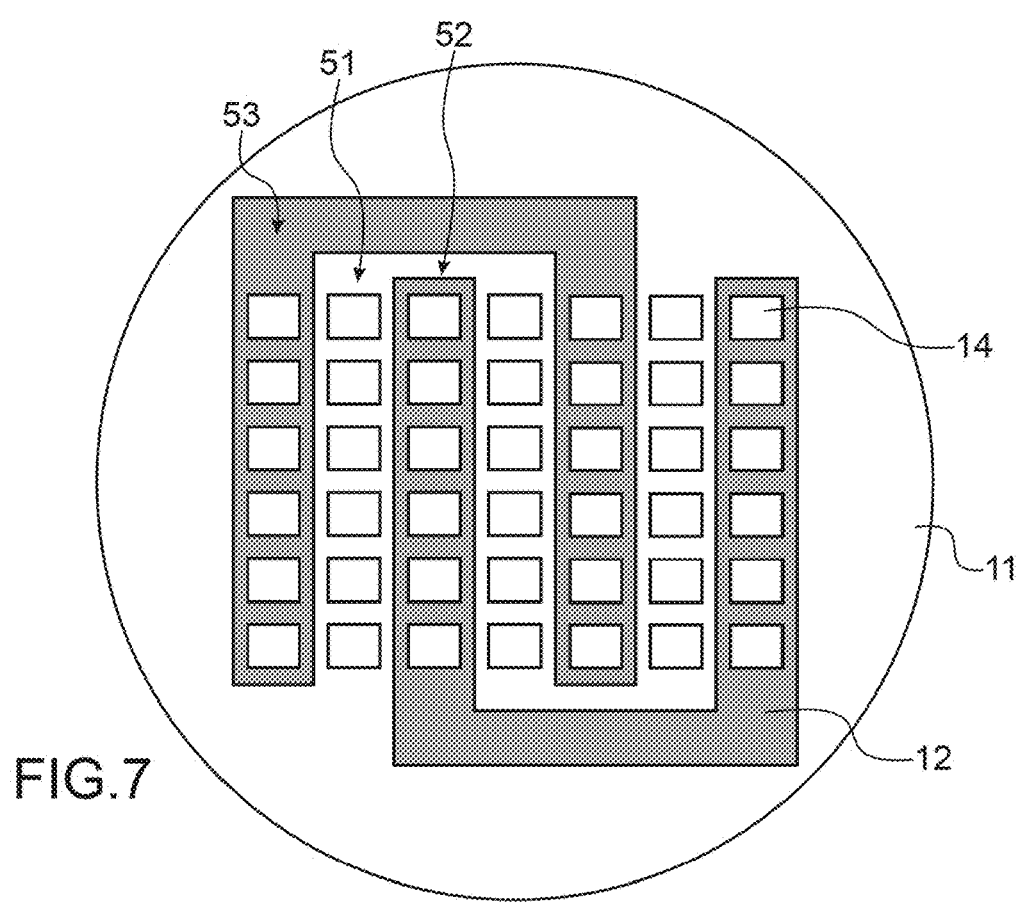
FIG. 7 shows, schematically and in plan view, the electrical interconnections of the series of mesas, according to a particular implementation of the second variant embodiment.

The second series of mesas S2 and the third series of mesas S3 are electrically insulated from each other, each series having an interconnection network that is particular to it, formed by the layer of doped In(x)GaN (FIG. 7).

Advantageously, the final lattice parameters of each of the mesas after the first epitaxy growth are: 3.184 Angs. for blue (the case of the non-porosified mesa), 3.202 Angs. for green and 3.238 Angs. for red.

Figure 5E:
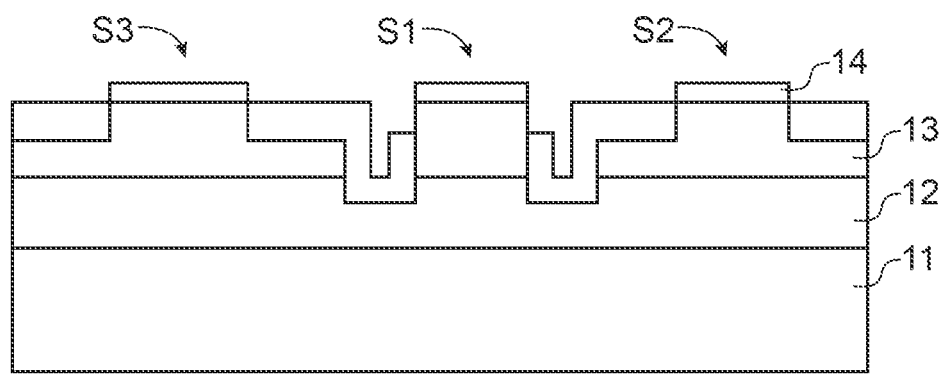

Advantageously, a masking of the intermesa space will be implemented by selective dielectric before the growth of the LEDs (FIG. 5E).

The growth mask can be obtained, for example, in accordance with the following sub-steps: depositing a dielectric layer ("liner") for example of SiN of approximately 80 nm by PECVD (conforming deposition), opening the top of the mesas by an autoaligned method (without having recourse to a lithography step): spreading a polymer that may be a lithography resin, full-wafer thinning in $O_2$ plasma to reveal the top of the mesas while leaving resin in the trenches between the mesas, then etching the SiN in fluorinated plasma in order to reveal the top of the mesas, and finally removing the resin.

Figure 5F:
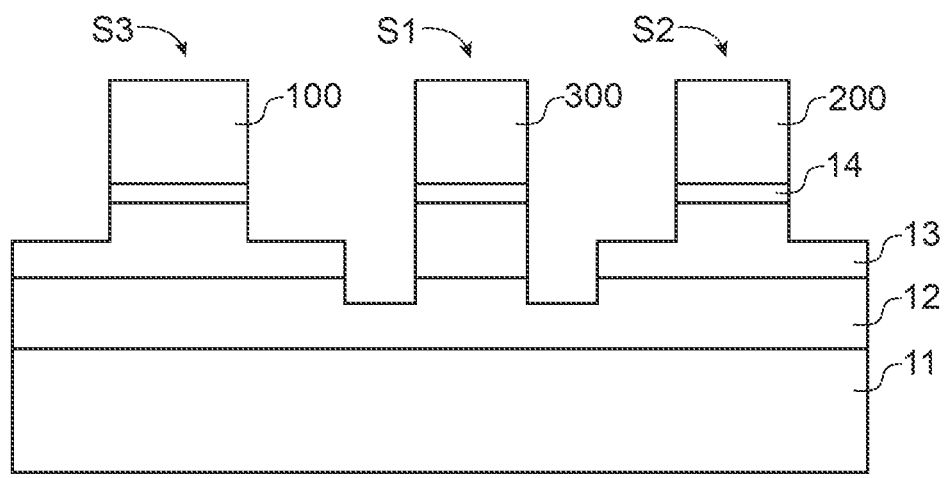

Finally, the same stack of layers is epitaxed on the three series of mesas S1, S2, S3 (FIG. 5F). Highly advantageously, according to this second variant embodiment of the method, this epitaxy regrowth is implemented in a single step, i.e. one and the same epitaxy recipe is implemented for depositing the stack of layers simultaneously on the three series of mesas. The various degrees of porosity and of relaxation of the mesas make it possible to obtain the three LED colours. The incorporation of In in the whole of the structure, and in particular in the quantum wells, is variable according to the degree of relaxation of the dense layer of the mesas. The more relaxed the layer, the more the emission wavelength increases.

For example, a completely InGaN epitaxy recipe will be selected to form a step 300 leading to an LED structure adapted for red on the second series of mesas S2. This same recipe will lead to a blue emission on the first series of mesas S1 and a green emission on the third series of mesas S3.

Figure 8:
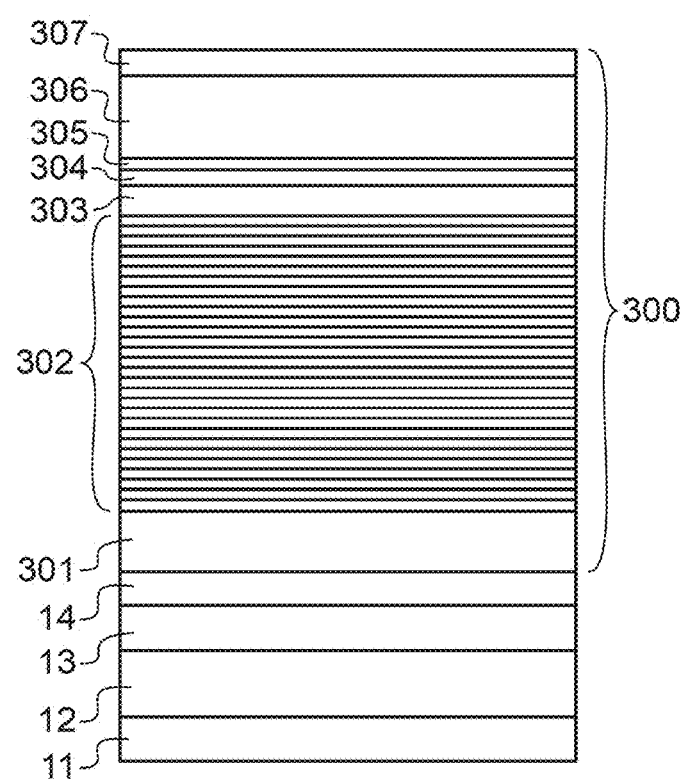
FIG. 8 shows, schematically and in cross section, an LED structure according to another particular embodiment of the invention.

The stack 300 that is deposited comprises successively, from the epitaxial regrowth layer of not-intentionally doped InGaN 13 of the base structure 10 (FIG. 8):

a layer of In(x)GaN 301, with x ranging from 10 to 20%, for example 15%, a layer of n doped InGaN 302 of 350 nm, formed by 15×$In_{0.15}Ga_{0.75}N$/GaN (thicknesses 22 nm/1.8 nm), an active zone 303 formed by multiple quantum wells (MQWs), formed by 5×$In_{0.40}Ga_{0.60}N$/$In_{0.15}Ga_{0.85}N$ (thicknesses 2.3 nm/5, 7, 11 nm), a layer of nid $In_{0.03}Ga_{0.97}N$ 304 (10 nm), an (Al, Ga)N:Mg layer 305 (20 nm), a layer of Mg doped $In_yGa_{1-y}N$ 306 with y=10-15% (125 nm), a layer of p+++ doped $In_yGa_{1-y}N$ 307 (25 nm).

At the end of the method, a native emission matrix emitting at at least two different wavelengths is obtained.

Hereinafter a native emission matrix emitting at at least three different wavelengths (preferably an RGB matrix) is described in more detail. The RGB matrix comprises for example:

a base structure 10 comprising successively a substrate 11, a layer of nid GaN 12, a layer of doped In(x)GaN 13 with x from 0 to 8% and an epitaxial regrowth layer of not-intentionally doped In(x)GaN 14, a first series of mesas S1 formed in the base structure comprising a part of the layer of nid GaN 12, the layer of doped In(x)GaN 13 and the epitaxial regrowth layer of not-intentionally doped In(x)GaN 14, the first series of mesas S1 being covered by a first series of blue LEDs, a second series of mesas S2 formed in the base structure 10 comprising a part of the layer of doped In(x)GaN 13 and the epitaxial regrowth layer of not-intentionally doped In(x)GaN 14, the part of the layer of doped In(x)GaN 13 being porosified, the first series of mesas S2 being covered by the second series of red LEDs, a third series of mesas S3 formed in the base structure 10 and covered by a third series of green LEDs.

According to a first variant embodiment, shown in FIG. 1J, the mesas in the third series S3 comprise a part of the layer of nid GaN 12, the layer of doped In(x)GaN 13 and the epitaxial regrowth layer of not-intentionally doped In(x)GaN 14. The third LED 300 and the second LED 200 are advantageously formed simultaneously by epitaxy.

According to a second variant embodiment shown on FIG. 5F, the mesas in the third series S3 comprise a part of the layer of doped In(x)GaN 13 and the epitaxial regrowth layer of not-intentionally doped In(x)GaN 14. The layer of doped In(x)GaN 13 in the third series of mesas S3 is porosified. The first series of LEDs, the second series of LEDs 200 and the third series of LEDs 300 are advantageously formed simultaneously by epitaxy.

REFERENCES

[1] Even et al., "Enhanced In incorporation in full InGaN heterostructure grown on relaxed InGaN pseudo-substrate», Appl. Phys. Lett. 110, 262103 (2017),
[2] Jang et al., "Electrical and structural properties of GaN films and GaN/InGaN light-emitting diodes grown on porous GaN templates fabricated by combined electrochemical and photoelectrochemical etching", Journal of Alloys and Compounds 589 (2014) 507-512.
[3] EP 3 840 065 A1.
[4] EP 3 840 016 A1.

What is claimed is:

1. A native emission matrix comprising:
   a base structure comprising successively a substrate, a layer of non-intentionally doped GaN, a layer of doped In(x)GaN with x from 0 to 8% and an epitaxial regrowth layer of not-intentionally doped In(x)GaN with x from 0 to 8%,
   a first mesa formed in the base structure, the first mesa comprising the layer of doped In(x)GaN, and a part of the thickness of the layer of non-intentionally doped GaN, the first mesa being covered by a first LED structure emitting at a first wavelength,
   a second mesa formed in the base structure, the second mesa comprising the epitaxial regrowth layer of not-intentionally doped In(x)GaN and a part of the thickness of the layer of doped In(x)GaN that is porosified, the second mesa being covered by a second LED structure emitting at a second wavelength,
   wherein the layer of non-intentionally doped GaN and the epitaxial regrowth layer of not-intentionally doped In(x)GaN have dopant concentrations preventing them from being porosified.

2. The matrix according to claim 1, wherein it comprises a third mesa formed in the base structure and covered by a third LED structure, emitting at a third wavelength.

3. The matrix according to claim 2, wherein the first LED structure emits in the blue, the second LED structure emits in the red and the third LED structure emits in the green, by means of which an RGB matrix is formed.

4. The matrix according to claim 2, wherein the third mesa comprises a part of the non-intentionally doped GaN layer, the layer of doped In(x)GaN and the epitaxial regrowth layer of not-intentionally doped In(x)GaN.

5. The matrix according to claim 2, wherein the third mesa comprises a part of the layer of doped In(x)GaN and the epitaxial regrowth layer of not-intentionally doped In(x)GaN,
   and wherein the layer of doped In(x)GaN of the third mesa is porosified.

* * * * *